United States Patent
Yamanaka et al.

(10) Patent No.: US 7,795,545 B2
(45) Date of Patent: Sep. 14, 2010

(54) HOT MELT WATER-RESISTANT STRUCTURE

(75) Inventors: Shouichi Yamanaka, Anjo (JP); Hiroyuki Ito, Chita (JP); Takayuki Kondo, Nagoya (JP)

(73) Assignee: Denso Corporation, Kariya (JP)

( * ) Notice: Subject to any disclaimer, the term of this patent is extended or adjusted under 35 U.S.C. 154(b) by 296 days.

(21) Appl. No.: 12/008,223

(22) Filed: Jan. 9, 2008

(65) Prior Publication Data

US 2008/0182063 A1 Jul. 31, 2008

(30) Foreign Application Priority Data

Jan. 25, 2007 (JP) ............... 2007-015437

(51) Int. Cl.
*H01L 23/48* (2006.01)
(52) U.S. Cl. ..................... 174/528; 174/521
(58) Field of Classification Search ............. 174/521, 174/528; 257/787, 788
See application file for complete search history.

(56) References Cited

U.S. PATENT DOCUMENTS 6,259,157 B1 * 7/2001 Sakamoto et al. ........... 257/723

2006/0164254 A1 7/2006 Kamizono et al.

FOREIGN PATENT DOCUMENTS

| JP | 04-084452 | 3/1992 |
|---|---|---|
| JP | 06-224237 | 8/1994 |
| JP | 08-031773 | 2/1996 |
| JP | 10-189834 | 7/1998 |
| JP | 2002-184513 | 6/2002 |
| JP | 2005-093905 | 4/2005 |
| JP | 2006-328993 | 12/2006 |

OTHER PUBLICATIONS

Office action dated Nov. 6, 2008 in Japanese Application No. 2007-015437 with English translation thereof.

* cited by examiner

*Primary Examiner*—Hung V Ngo
(74) *Attorney, Agent, or Firm*—Harness, Dickey & Pierce, PLC

(57) ABSTRACT

A hot melt water-resistant structure includes: an object to be protected from water; and a resin cover for covering an outside of the object and made of hot melt resin. The object includes an exposed surface and a side surface with a sidewall. The exposed surface is exposed from the resin cover. The side surface surrounds the exposed surface. The sidewall protrudes from the side surface continuously or intermittently. The resin cover covers and contacts the side surface with the sidewall.

8 Claims, 6 Drawing Sheets

HOT MELT WATER-RESISTANT STRUCTURE

CROSS REFERENCE TO RELATED APPLICATION

This application is based on Japanese Patent Application No. 2007-15437 filed on Jan. 25, 2007, the disclosure of which is incorporated herein by reference.

FIELD OF THE INVENTION

The present invention relates to a hot melt water-resistant structure.

BACKGROUND OF THE INVENTION

Figure 16:
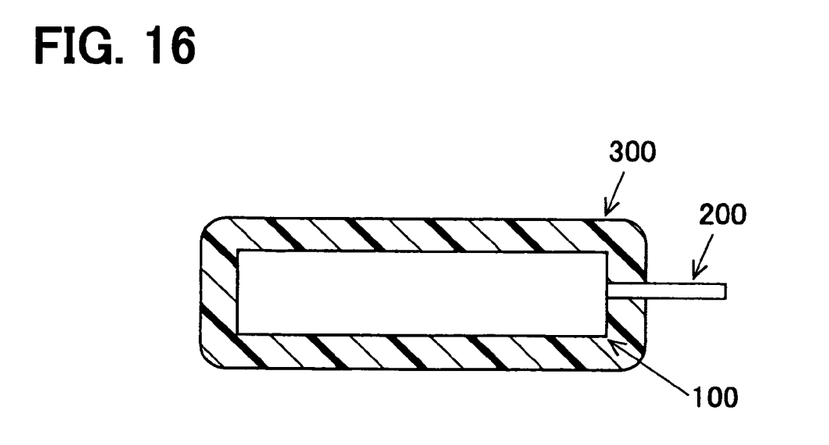
FIG. 16 is a cross sectional view showing a hot melt water-resistant structure of a casing, according to a prior art.

It is required for an electric device to protect the device from water, i.e., high water-resistant reliability is required for the electric device. To protect the device, hot melt resin is coated on an outer surface of the device as an object to be protected from water. This structure is defined as a hot melt water-resistant structure. For example, JP-A-2002-184513 discloses this structure. Specifically, hot melt adhesive is applied to an inner wall of a heat-shrinkable tube, and a connection portion of a cable is covered with the heat-shrinkable tube. FIG. 16 shows a conventional hot melt water-resistant structure composed of a casing 100 for accommodating an electric device, a wiring member 200 and a resin cover 300 for covering the casing 100. The wiring member 200 has a film shape, and protrudes from the casing 100. The resin cover 300 is made of hot melt resin, and covers the whole outer surface of the casing 100 as an object to be protected from water.

However, when an electric device has a casing for accommodating a large-scale printed circuit board, the area of the whole outer surface of the casing as an object to be covered by hot melt resin becomes large. Accordingly, the amount of hot melt resin increases although the unit price of the hot melt resin is high. Thus, the manufacturing cost of the device becomes large. Further, heat generated in the printed circuit board increases, so that performance of an electric circuit on the board may be reduced.

Thus, it is required for the hot melt water-resistant structure to reduce its manufacturing cost and to improve water-resistant reliability.

SUMMARY OF THE INVENTION

In view of the above-described problem, it is an object of the present disclosure to provide a hot melt water-resistant structure.

Accordingly a first aspect of the present disclosure, a hot melt water-resistant structure includes: an object to be protected from water; and a resin cover for covering an outside of the object and made of hot melt resin. The object includes an exposed surface and a side surface with a sidewall. The exposed surface is exposed from the resin cover. The side surface surrounds the exposed surface. The sidewall protrudes from the side surface continuously or intermittently. The resin cover covers and contacts the side surface with the sidewall.

The manufacturing cost of the above hot melt water-resistant structure is reduced, and water-resistant reliability of the structure is improved.

According to a second aspect of the present disclosure, a hot melt water-resistant structure includes: a device to be protected from water; and a resin cover for covering an outside of the device and made of hot melt resin. The device includes top and bottom surfaces and a plurality of side surfaces. The bottom surface is exposed from the resin cover, and the top surface is covered with the resin cover. The multiple side surfaces surrounds the bottom surface. The device further includes a protrusion, which protrudes from at least one of the plurality of side surfaces. The resin cover covers the plurality of side surfaces with the protrusion.

The manufacturing cost of the above hot melt water-resistant structure is reduced, and the water-resistant reliability of the structure is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
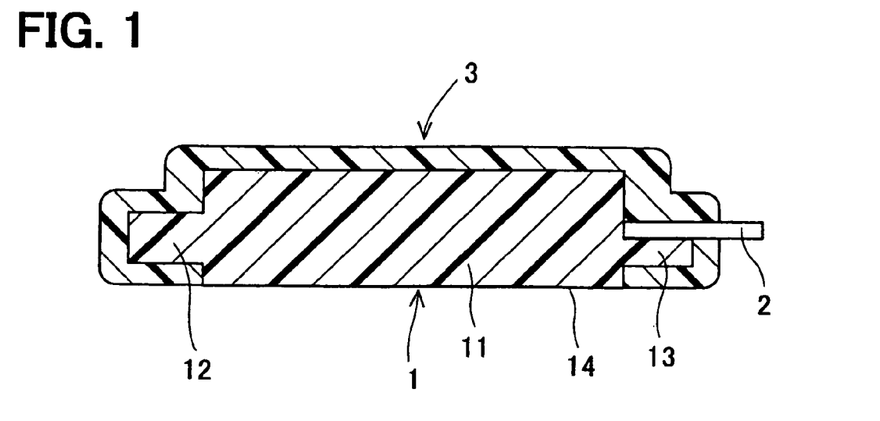
FIG. 1 is a cross sectional view showing a hot melt water-resistant structure of a casing for accommodating an electric circuit therein, according to an example embodiment.

A hot melt water-resistant structure according to an example embodiment of the present disclosure is shown in FIG. 1. The structure is used for an electric device including a casing 1, an electric circuit and a wiring member 2. FIG. 1 shows the water-resistant electric device. The casing 1 has a box and a cover. The box has an upper opening, and the cover covers the upper opening of the box. The cover is connected to the box. Accordingly, there is no need for the bottom side 14 of the box to protect from water by using hot melt resin cover. The wiring member 2 has a film shape or a plate shape, and extends and protrudes from a right side of the casing 1 toward a right direction. The wiring member 2 is composed of a flexible circuit board.

The casing 1 has left, front and back sides. A sidewall 12 as a protrusion protrudes from each of the left, front and back sides toward a lateral direction. The sidewall 12 has a rectangular shape. The sidewall 12 provides a casing sidewall. Another sidewall 13 protrudes from the right side of the casing 1. The other sidewall 13 as a right sidewall contacts a bottom of the wiring member 2. The other sidewall 13 provides a wiring sidewall. The other sidewall 13 is connected to the sidewall 12 so that the sidewalls 12, 13 as a protrusion surround the casing 1. Specifically, the protrusion surrounds the whole sides of the casing 1. Here, the sidewall 12, 13 is a protrusion having a rib shape. The sidewall 12, 13 may be integrated with the casing 1 as an object to be protected from water. Alternatively, the sidewall 12, 13 may be formed independently from the casing 1, and after that, the sidewall 12, 13 may be bonded to the casing 1.

The outer surface of the casing 1 other than the bottom side 14 is covered with a resin cover 3 made of hot melt resin. The resin cover 3 is formed on the outer surface of the casing 1 such that hot melt resin having predetermined fluidity and heat shrinkage property is adhered to the outer surface by using a hot melt method. A composition of the hot melt resin may be a conventional composition, and the hot melt method may be a conventional hot melt method as long as the hot melt resin has a sufficient heat shrinkage property.

In this case, the resin cover 3 is strongly adhered to the sidewalls 12, 13 and the top of the casing 1. Thus, water is prevented from penetrating into the casing 1 through a boundary between a periphery around the bottom side 14 of the casing 1 and the resin cover 3. Further, the amount of the hot melt resin is reduced. In the hot melt water-resistant structure, a manufacturing cost is reduced, and water-resistant reliability is improved.

Figure 2:
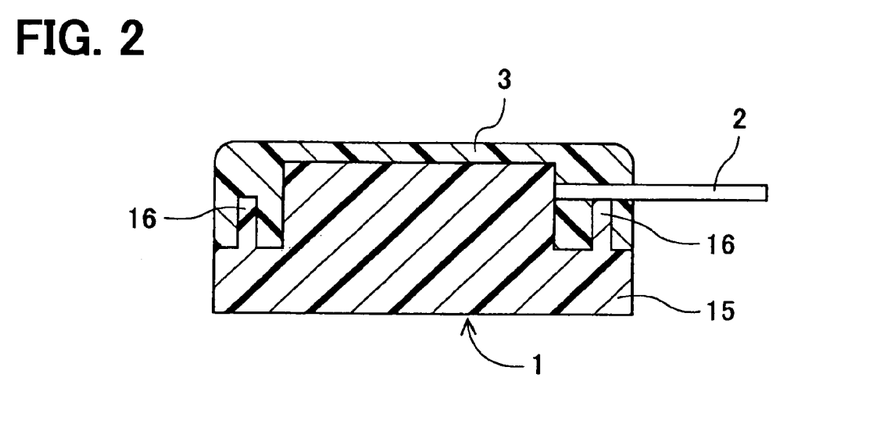
FIG. 2 is a cross sectional view showing a hot melt water-resistant structure of a casing, according to a modification of the example embodiment.

FIG. 2 shows a water-resistant electric device as a hot melt water-resistant structure, according to a modification of the example embodiment.

The casing 1 includes a protruded bottom portion 15, which protrudes from a bottom portion of the sidewall of the casing 1 in a lateral direction of the casing 1. The protruded bottom portion 15 has a rectangular ring shape, and a vertical wall 16 protrudes from a top of the protruded bottom portion 15. The vertical wall 16 is in parallel to the sidewall of the casing 1, and surrounds the sidewall of the casing 1. The vertical wall 16 provides both of an outer wall of the casing 1 and a wiring of the casing 1.

In the above casing 1, water-resistant reliability is improved.

Figure 3:
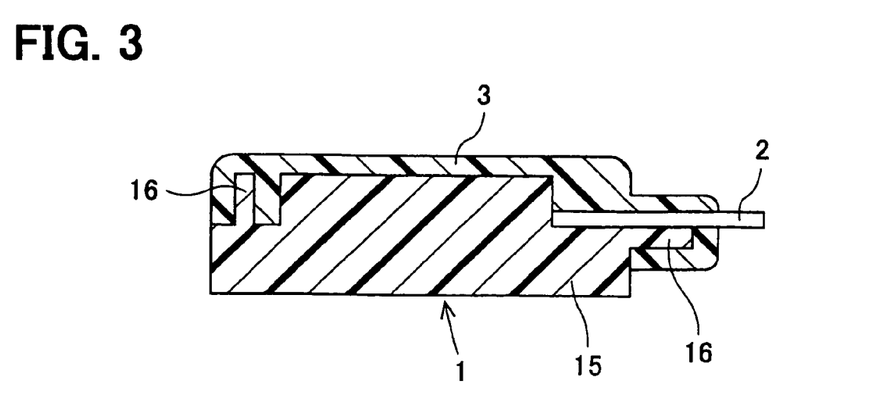
FIG. 3 is a cross sectional view showing a hot melt water-resistant structure of a casing, according to a second modification of the example embodiment.

FIG. 3 shows a water-resistant electric device as a hot melt water-resistant structure, according to a second modification of the example embodiment. The casing 1 includes the protruded bottom portion 15 and the vertical wall 16. A part of the vertical wall 16 disposed on the right side of the casing 1 contacts the wiring member 2, and further, extends along with the extending direction of the wiring member 2. The top surface of the protruded bottom portion 15 contacts the bottom of the wiring member 2. Thus, the hot melt water-resistant structure having high water-resistant reliability is formed.

Figure 4A:
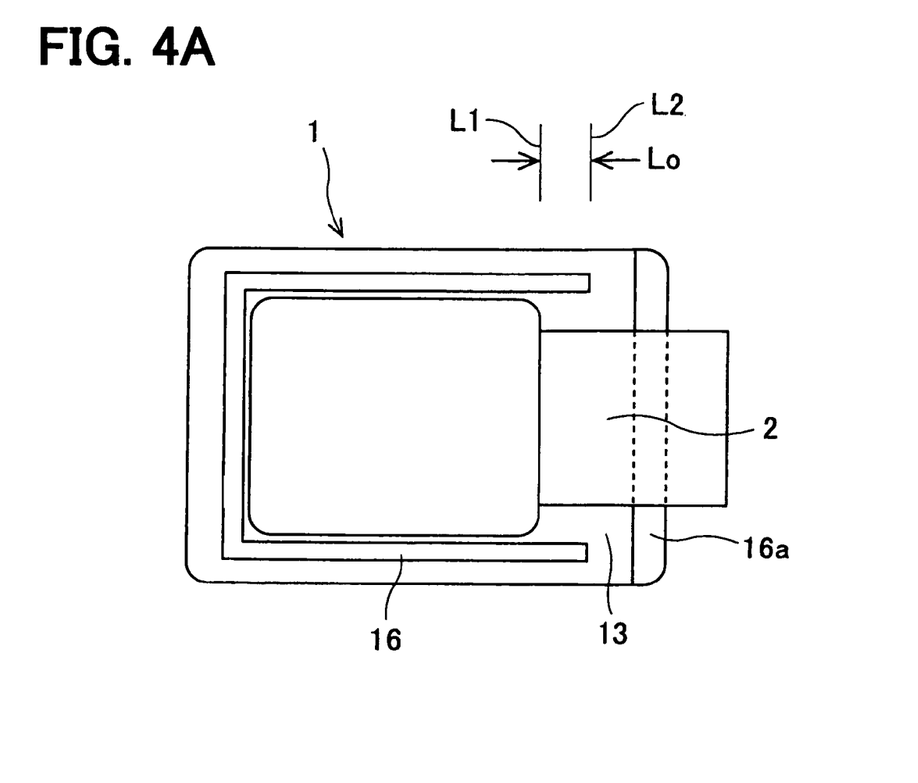
FIG. 4A is a plan view showing a hot melt water-resistant structure of a casing without a resin cover.
Figure 4B:
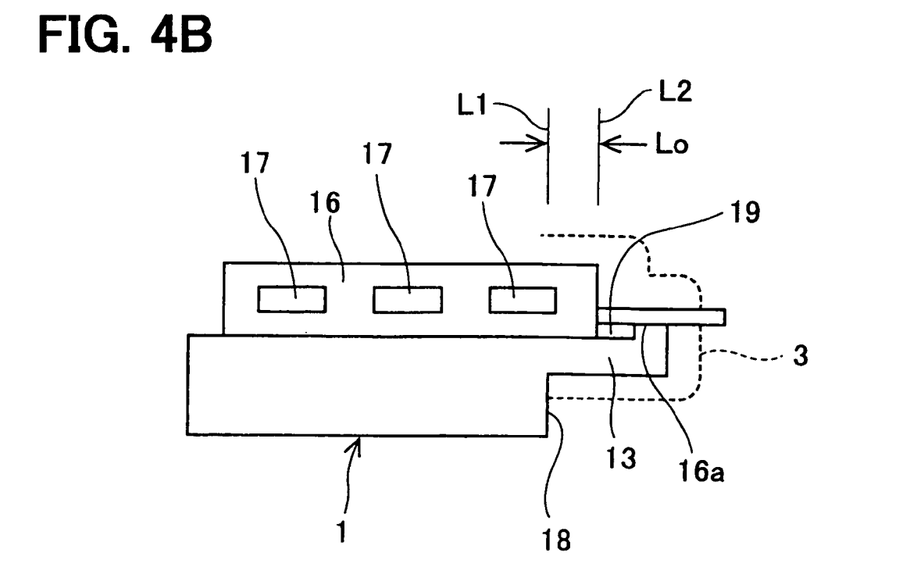
FIG. 4B is a side view showing the structure, according to a third modification of the example embodiment.

FIGS. 4A and 4B show a water-resistant electric device as a hot melt water-resistant structure, according to a third modification of the example embodiment. The vertical wall 16 has multiple through holes 17, which are arranged at predetermined regular intervals along with the extending direction of the vertical wall. FIGS. 4A and 4b show the device without the resin cover 3. The casing has a square shape having four sides. The vertical wall 16 is disposed on each side of the square shape.

The sidewall 13 as the right sidewall for the casing 1 protrudes from a bottom sidewall 18 along with the extending direction of the wiring member 2. The bottom sidewall 18 is disposed on an extending side of the wiring member 2. A top sidewall 16a is formed on a top end of the sidewall 13, and disposed under the wiring member 2. A clearance 19 is formed between the vertical sidewall 16 and the top sidewall 16a. All sidewalls, the clearance 19 and the through holes 17 are covered with the resin cover 3.

In FIG. 4A, the right side of the casing is defined as L1, the right side of the vertical sidewall 16 is defined as L2. Accordingly, the vertical sidewall 16 and the sidewall 13 overlap each other. Here, the amount of overlapping is defined as L0. Thus, the water-resistant reliability is much improved.

Figure 5A:
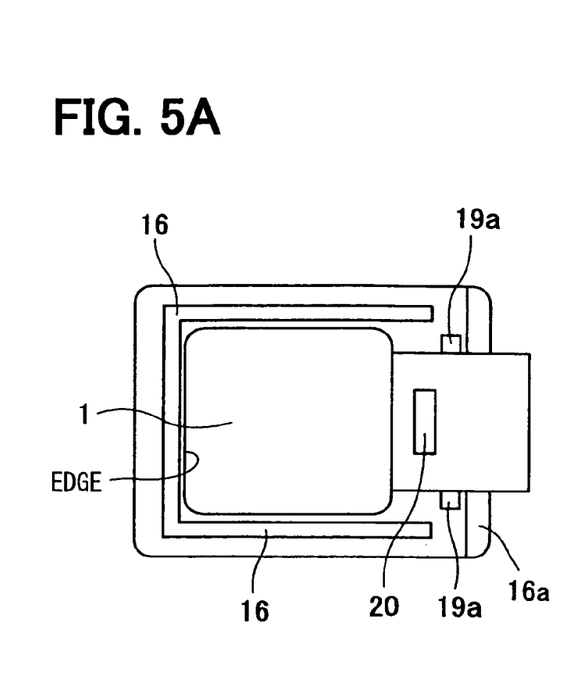
FIG. 5A is a plan view showing a hot melt water-resistant structure of a casing without a resin cover.
Figure 5B:
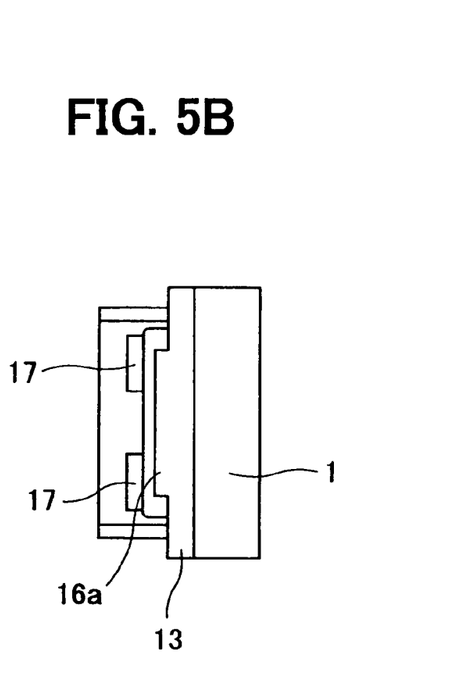
FIGS. 5B and 5C are side views showing the structure, according to a fourth modification of the example embodiment.
Figure 5C:
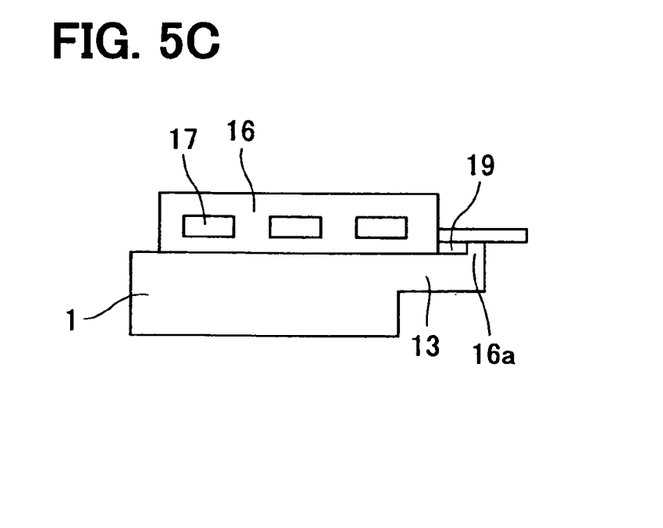

FIGS. 5A to 5C show a water-resistant electric device as a hot melt water-resistant structure, according to a fourth modification of the example embodiment.

The sidewall 13 has a pair of through holes 19a disposed on each side of the wiring member 2. Further, the wiring member 2 has a through hole 20. FIGS. 5A to 5C show the device without the resin cover 3. The sidewalls, the through holes and the clearance are covered with the resin cover 3. Thus, the water-resistant reliability is much improved.

Figure 6:
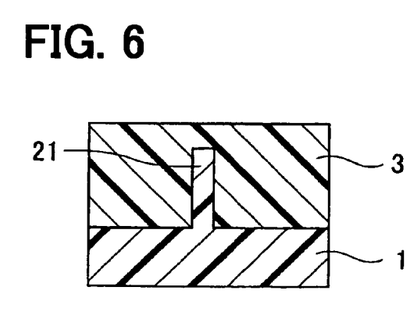
FIG. 6 is a cross sectional view showing a hot melt water-resistant structure of a casing, according to a fifth modification of the example embodiment.

FIG. 6 shows a water-resistant electric device as a hot melt water-resistant structure, according to a fifth modification of the example embodiment. A vertical sidewall 21 having a plate shape is formed at a center portion or a predetermined position of the top surface of the casing 1. The vertical sidewall 21 stands on the top surface of the casing 1.

Figure 7:
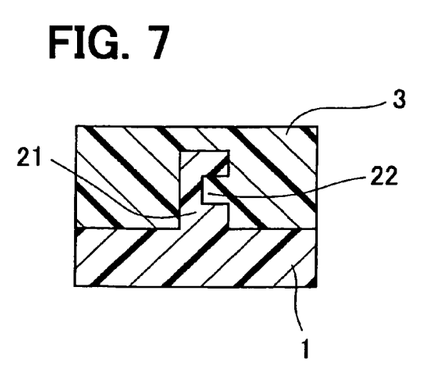
FIG. 7 is a cross sectional view showing a hot melt water-resistant structure of a casing, according to a sixth modification of the example embodiment.

FIG. 7 shows a water-resistant electric device as a hot melt water-resistant structure, according to a sixth modification of the example embodiment. A groove 22 having a concavity shape is formed at a predetermined position of the vertical sidewall 21. The groove 22 increases adhesive force, which is similar to a through hole. Thus, the water-resistant reliability is much improved.

Figure 8:
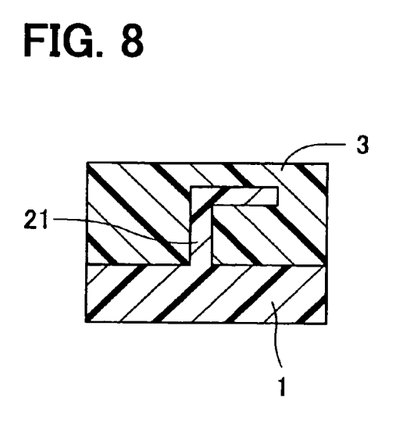
FIG. 8 is a cross sectional view showing a hot melt water-resistant structure of a casing, according to a seventh modification of the example embodiment.

FIG. 8 shows a water-resistant electric device as a hot melt water-resistant structure, according to a seventh modification of the example embodiment. The vertical sidewall 21 has a reverse L shape so that the reverse L shape functions as a groove. Thus, the vertical sidewall 21 increases adhesive force, which is similar to a through hole. Thus, the water-resistant reliability is much improved.

Figure 9:
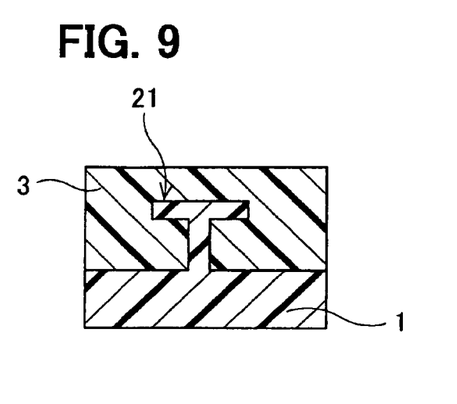
FIG. 9 is a cross sectional view showing a hot melt water-resistant structure of a casing, according to an eight modification of the example embodiment.

FIG. 9 shows a water-resistant electric device as a hot melt water-resistant structure, according to an eighth modification of the example embodiment. The vertical sidewall 21 has a T shape so that the T shape functions as a groove. Specifically, each side of the T shape provides a groove. Thus, the vertical sidewall 21 increases adhesive force, which is similar to a through hole. Thus, the water-resistant reliability is much improved.

Figure 10:
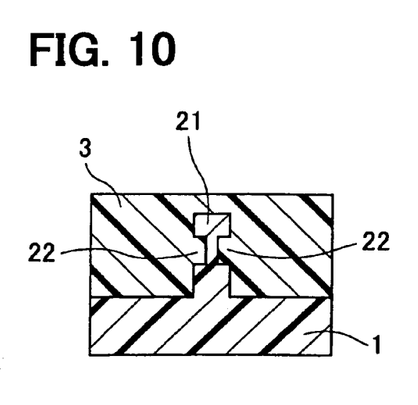
FIG. 10 is a cross sectional view showing a hot melt water-resistant structure of a casing, according to a ninth modification of the example embodiment.

FIG. 10 shows a water-resistant electric device as a hot melt water-resistant structure, according to a ninth modification of the example embodiment. The vertical sidewall 21 has a pair of grooves 22, which is disposed on both sides of the sidewall 21. Thus, the vertical sidewall 21 increases adhesive force, which is similar to a through hole. Thus, the water-resistant reliability is much improved.

Figure 11:
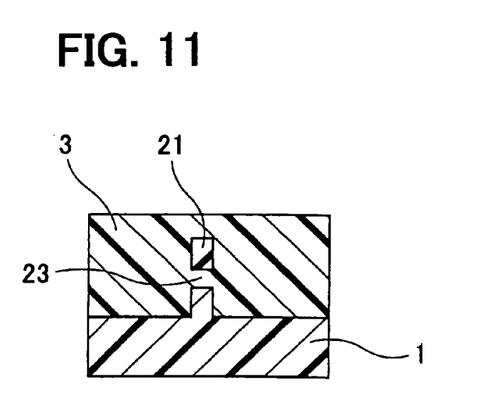
FIG. 11 is a cross sectional view showing a hot melt water-resistant structure of a casing, according to a tenth modification of the example embodiment.
Figure 12:
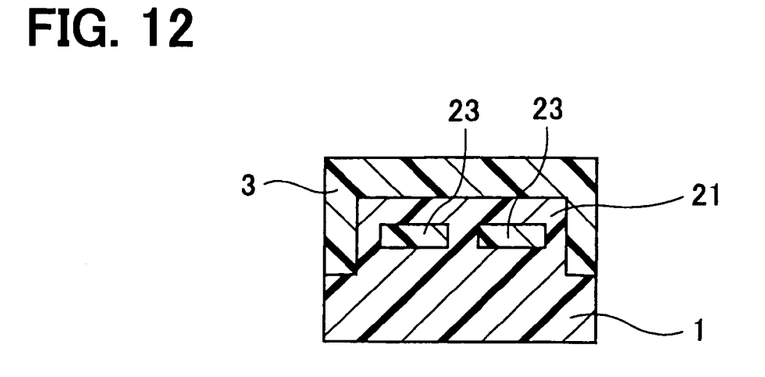
FIG. 12 is a cross sectional view showing a hot melt water-resistant structure of a casing, according to the tenth modification of the example embodiment.
Figure 13:
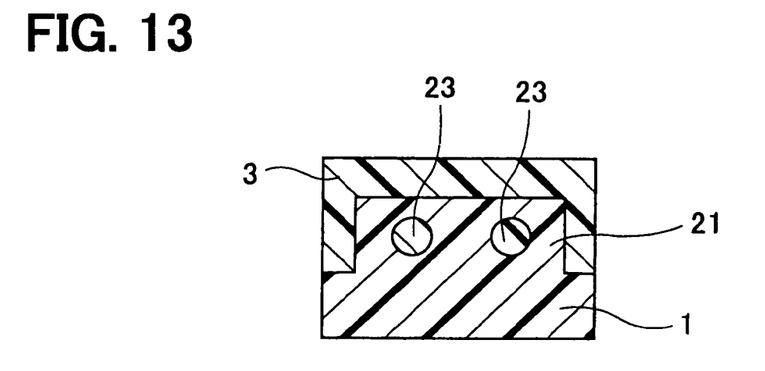
FIG. 13 is a cross sectional view showing a hot melt water-resistant structure of a casing, according to the tenth modification of the example embodiment.

FIG. 11 shows a water-resistant electric device as a hot melt water-resistant structure, according to a tenth modification of the example embodiment. The vertical sidewall 21 has a through hole 23, which is disposed on a center of the sidewall 21. Thus, the vertical sidewall 21 increases adhesive force. Thus, the water-resistant reliability is much improved. The through hole 23 may have a square shape, as shown in FIG. 12. Alternatively, the through hole 23 may have a round shape, as shown in FIG. 13. Further, the through hole 23 may have another shape.

Figure 14:
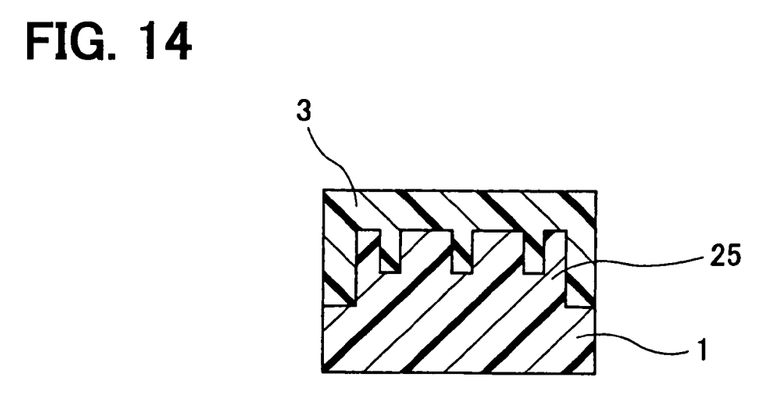
FIG. 14 is a cross sectional view showing a hot melt water-resistant structure of a casing, according to an eleventh modification of the example embodiment.

FIG. 14 shows a water-resistant electric device as a hot melt water-resistant structure, according to an eleventh modification of the example embodiment. The vertical sidewall 25 has a comb-teeth groove. The vertical sidewall 25 increases adhesive force, which is similar to a through hole. Thus, the water-resistant reliability is much improved.

Figure 15:
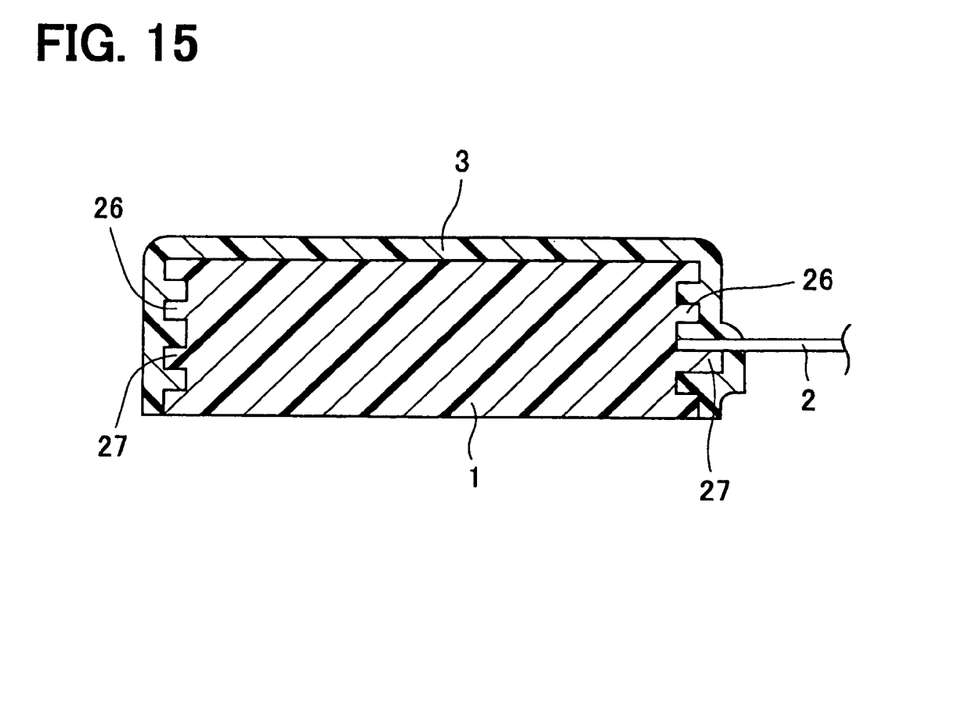
FIG. 15 is a cross sectional view showing a hot melt water-resistant structure of a casing, according to a twelfth modification of the example embodiment.

FIG. 15 shows a water-resistant electric device as a hot melt water-resistant structure, according to a twelfth modification of the example embodiment. The casing 1 includes multiple ring shape sidewalls 26, 27. Each sidewall 26 has a ring shape surrounding the whole sidewalls of the casing 1. The ring shape sidewalls 26, 27 are spaced apart from each other at predetermined intervals. Since the casing 1 has multiple sidewalls 26, 27, a protrusion height of each sidewall 26, 27 is comparatively small. Thus, the dimensions of the casing 1 are reduced. Each sidewall 26, 27 protrudes from a bottom of a concavity on the outer side of the casing 1. Thus, the dimensions of the casing 1 are much reduced. Further, the adhesive force is much improved, and the water-resistant reliability is much improved.

The above disclosure has the following aspects.

Accordingly a first aspect of the present disclosure, a hot melt water-resistant structure includes: an object to be protected from water; and a resin cover for covering an outside of the object and made of hot melt resin. The object includes an exposed surface and a side surface with a sidewall. The exposed surface is exposed from the resin cover. The side surface surrounds the exposed surface. The sidewall protrudes from the side surface continuously or intermittently. The resin cover covers and contacts the side surface with the sidewall.

In the above structure, the hot melt resin strongly adheres to the sidewall since the hot melt resin has adhesiveness and thermal shrinkability. Thus, a connection portion between the hot melt resin and the sidewall is prevented water from penetrating into the connection portion. Further, the exposed surface is not covered with the hot melt resin. Thus, the amount of the hot melt resin is reduced. Furthermore, heat amount of the object is also reduced. Further, the rigidity of the exposed surface may be improved, so that mounting performance of the object is increased, and that the heat radiation performance of the object is also increased. Thus, the manufacturing cost of the hot melt water-resistant structure is reduced, and water-resistant reliability of the structure is improved.

Further, since the resin cover strongly adheres to the sidewall, the adhesiveness and the water-resistant performance are much improved. Specifically, the heat shrinkability in relation to the resin cover generates a tension toward a center of the resin cover. This tension functions to press the resin cover on the sidewall, so that the water-resistant performance is improved.

The sidewall protrudes from the side surface intermittently so that multiple sidewall portions have a clearance therebetween. When the clearance is small, the water-resistant performance is comparatively high. However, when the clearance is large, the water-resistant performance may be insufficient. Thus, the clearance has an upper limit as long as the water-resistant performance is sufficient. Preferably, the clearance is equal to or smaller than 10 mm, and more preferably, the clearance is equal to or smaller than 5 mm.

Alternatively, the side surface may include a main side surface, and the sidewall may continuously cover a part of a whole circumference of the exposed surface, which corresponds to the main side surface.

Alternatively, the sidewall may include a plurality of sidewall parts, and each sidewall part may protrude from a different part of the side surface toward a different direction, respectively. Further, at least two of the sidewall parts may overlap each other when seen from a predetermined direction, and each sidewall part continuously may surround a part of a whole circumference of the exposed surface. Specifically, when seen from a direction in parallel to a main surface of the object, the sidewall parts may have a clearance therebetween. The resin cover adheres the main surface of the object, and heat shrinkability of the resin cover on the main surface becomes larger. Accordingly, a large pressure is applied from the resin cover to the main surface of the object. Thus, the water-resistant performance is much improved.

Further, the object may further include a casing made of resin and a wiring. The casing accommodates an electric device. The wiring protrudes from the casing so that the wiring is exposed from the resin cover. The plurality of sidewall parts includes a first sidewall part and a second sidewall part. The first sidewall part continuously surrounds a whole circumference of the exposed surface other than a part of the whole circumference corresponding to the wiring. The second sidewall part is disposed adjacent to the wiring, and protrudes toward a second direction different from a first direction to which the first sidewall part protrudes. Furthermore, the second sidewall part may contact the wiring, and the second direction of the second sidewall part may be in parallel to a direction to which the wiring protrudes.

Alternatively, the object may have a polygonal shape having a plurality of sides. The sidewall includes a plurality of sidewall parts, and each sidewall part is disposed on the side of the polygonal shape.

According to a second aspect of the present disclosure, a hot melt water-resistant structure includes: a device to be protected from water; and a resin cover for covering an outside of the device and made of hot melt resin. The device includes top and bottom surfaces and a plurality of side surfaces. The bottom surface is exposed from the resin cover, and the top surface is covered with the resin cover. The multiple side surfaces surrounds the bottom surface. The device further includes a protrusion, which protrudes from at least one of the plurality of side surfaces. The resin cover covers the plurality of side surfaces with the protrusion.

The manufacturing cost of the above hot melt water-resistant structure is reduced, and the water-resistant reliability of the structure is improved.

Alternatively, the structure may further include: a wiring member having a plate shape. The wiring member protrudes from one of the plurality of side surfaces of the device so that the wiring member is exposed from the resin cover, and the protrusion continuously surrounds all of the plurality of side surfaces. Further, the protrusion may include a plurality of protruding portions, each of which corresponds to the side surface. Each protruding portion protrudes from the side surface toward a direction in parallel to the top surface of the device. The wiring member protrudes from the side surface toward a direction in parallel to the top surface of the device, and the wring member contacts one of the plurality of protruding portions. Furthermore, at least one of the plurality of protruding portions may include a plurality of through holes, and each through hole may be filled with the resin cover so that adhesiveness between the resin cover and the device increases.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A hot melt water-resistant structure comprising:
an object to be protected from water; and
a resin cover for covering an outside of the object and made of hot melt resin, wherein
the object includes an exposed surface and a side surface with a sidewall,
the exposed surface is exposed from the resin cover,
the side surface surrounds the exposed surface,
the sidewall protrudes from the side surface continuously or intermittently,
the resin cover covers and contacts the side surface with the sidewall,
the sidewall includes a plurality of sidewall parts,
each sidewall part protrudes from a different part of the side surface toward a different direction, respectively,
the object further includes a casing made of resin and a wiring,
the casing accommodates an electric device,
the wiring protrudes from the casing so that the wiring is exposed from the resin cover,
the plurality of sidewall parts includes a first sidewall part and a second sidewall part,
the first sidewall part continuously surrounds a whole circumference of the exposed surface other than a part of the whole circumference corresponding to the wiring,
the second sidewall part is disposed adjacent to the wiring, and protrudes toward a second direction different from a first direction to which the first sidewall part protrudes;
the second sidewall part contacts the wiring, and
the second direction of the second sidewall part is in parallel to a direction to which the wiring protrudes.

2. The structure according to claim 1, wherein
the sidewall continuously surrounds a whole circumference of the exposed surface.

3. The structure according to claim 1, wherein
the side surface includes a main side surface, and the sidewall continuously covers a part of a whole circumference of the exposed surface, which corresponds to the main side surface.

4. The structure according to claim 1, wherein
at least two of the sidewall parts overlap each other when seen from a predetermined direction, and
each sidewall part continuously surrounds a part of a whole circumference of the exposed surface.

5. The structure according to claim 1, wherein
the object has a polygonal shape having a plurality of sides,
the sidewall includes a plurality of sidewall parts, and
each sidewall part is disposed on the side of the polygonal shape.

6. A hot melt water-resistant structure comprising:
an object to be protected from water; and
a resin cover for covering an outside of the object and made of hot melt resin, wherein
the object includes an exposed surface and a side surface with a sidewall,
the exposed surface is exposed from the resin cover,
the side surface surrounds the exposed surface,
the sidewall protrudes from the side surface continuously or intermittently,
the resin cover covers and contacts the side surface with the sidewall,
the sidewall includes a plurality of through holes, and
each through hole is filled with the resin cover.

7. A hot melt water-resistant structure comprising:
a device to be protected from water;
a resin cover for covering an outside of the device and made of hot melt resin and a wiring member having a plate shape, wherein
the device includes top and bottom surfaces and a plurality of side surfaces,
the bottom surface is exposed from the resin cover, and the top surface is covered with the resin cover,
the multiple side surfaces surrounds the bottom surface,
the device further includes a protrusion, which protrudes from at least one of the plurality of side surfaces,
the resin cover covers the plurality of side surfaces with the protrusion,
the wiring member protrudes from one of the plurality of side surfaces of the device so that the wiring member is exposed from the resin cover,
the protrusion continuously surrounds all of the plurality of side surfaces,
the protrusion includes a plurality of protruding portions, each of which corresponds to the side surface,
each protruding portion protrudes from the side surface toward a direction in parallel to the top surface of the device,
the wiring member protrudes from the side surface toward a direction in parallel to the top surface of the device, and
the wiring member contacts one of the plurality of protruding portions.

8. The structure according to claim 7, wherein
at least one of the plurality of protruding portions includes a plurality of through holes, and
each through hole is filled with the resin cover so that adhesiveness between the resin cover and the device increases.

* * * * *